United States Patent
Hiraoka et al.

(10) Patent No.: US 6,900,976 B2
(45) Date of Patent: May 31, 2005

(54) VARIABLE CAPACITOR ELEMENT AND INTEGRATED CIRCUIT HAVING VARIABLE CAPACITOR ELEMENT

(75) Inventors: Yukio Hiraoka, Nishinomiya (JP); Hiroki Kojima, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 76 days.

(21) Appl. No.: 10/717,701

(22) Filed: Nov. 19, 2003

(65) Prior Publication Data

US 2004/0100752 A1 May 27, 2004

(30) Foreign Application Priority Data

Nov. 20, 2002 (JP) ........................... 2002-337167

(51) Int. Cl.⁷ .................................................. H01G 5/00
(52) U.S. Cl. ..................... 361/277; 361/278; 361/299.5; 257/300
(58) Field of Search ................................ 361/277, 280, 361/292, 299.2, 306.1, 329, 306.3; 257/303, 306, 308, 310

(56) References Cited

U.S. PATENT DOCUMENTS

| | | | | |
|---|---|---|---|---|
| 5,576,250 A | * | 11/1996 | Diem et al. | 438/50 |
| 5,854,097 A | * | 12/1998 | Ohmi et al. | 438/182 |
| 6,448,604 B1 | * | 9/2002 | Funk et al. | 257/312 |
| 6,524,923 B2 | * | 2/2003 | Funk et al. | 438/379 |
| 6,563,387 B2 | | 5/2003 | Hirano et al. | |

FOREIGN PATENT DOCUMENTS

| | | |
|---|---|---|
| JP | 2001-196853 | 7/2001 |
| JP | 2001-339301 | 12/2001 |
| JP | 2001-352218 | 12/2001 |
| WO | 01/52401 | 7/2001 |

* cited by examiner

*Primary Examiner*—Anthony Dinkins
(74) *Attorney, Agent, or Firm*—Merchant & Gould P.C.

(57) ABSTRACT

A variable capacitor element including: a buried electrode layer of a conductivity type different from a semiconductor substrate; a wiring layer connected to the lead portion of the buried electrode layer; a pair of capacitive insulating films that are formed as regions having mutually opposing adjacent sides in a plane shape on a portion of the buried electrode layer excluding the lead portion; an insulator layer formed on the border region of each outside of the pair of capacitive insulating films in a direction perpendicular to the adjacent sides; a pair of conductor layers formed both on the respective capacitive insulating films and on the respective insulator layers; and wiring layers that are connected respectively to lead portions of the pair of conductor layers above the insulator layer. The capacitance value between the buried electrode layer and each of the conductor layers can be changed by changing the voltage between the buried electrode layer and the conductor layers. A parasitic capacitance between the respective variable capacitor elements is reduced.

8 Claims, 6 Drawing Sheets

VARIABLE CAPACITOR ELEMENT AND INTEGRATED CIRCUIT HAVING VARIABLE CAPACITOR ELEMENT

BACKGROUND OF THE INVENTION

1. Field of the Invention

The present invention relates to variable capacitor elements, and more particularly to variable capacitor elements contained in integrated circuits for use in high frequency circuits.

2. Description of the Related Art

With the recent developments in markets for the mobile communication devices such as cellular phones, it has become increasingly important to integrate, on ICs, elements such as inductors and capacitors that conventionally have been used as separate components, in order to realize the miniaturization, lower cost and the like for circuits. One of such elements is the variable capacitor element. Variable capacitor elements are used for applications such as changing the oscillation frequency of an oscillation circuit.

Examples of conventional technologies of this kind include a frequency synthesizer containing a VCO circuit with switching means for a capacitor (see e.g., JP2001-339301 A), a band-switched integrated voltage controlled oscillator (see e.g., JP2001-196853 A) and a voltage controlled oscillator with an additional function of frequency correction using a variable capacitor element (see e.g., JP2001-352218 A).

FIG. 6A shows the planar structure of a conventional variable capacitor element constructed on an IC. FIG. 6B shows a cross section taken along line B—B in FIG. 6A. In FIGS. 6A and 6B, a numeral 301 denotes a p-type silicon substrate; 302 denotes an n-type buried electrode layer; 303 denotes an n-type surface electrode layer; 304 and 309 denote a first gate electrode layer and a second gate electrode layer, respectively; and 305 and 310 denote a first gate oxide film and a second gate oxide film, respectively. Numerals 306 and 311 denote via-holes on the first and second gate electrodes, respectively; 307 and 312 denote wiring layers for first and second gate electrodes, respectively; 308 denotes an insulator layer; 313 denotes a via-hole on the n-type buried electrode; and 314 denotes a wiring layer for the n-type buried electrode.

The n-type buried electrode layer 302 is formed in a surface region of the p-type silicon substrate 301, which is of a different conductivity type. The first and second gate oxide films 305 and 310 each have a rectangular shape, and are formed such that the long sides of the films 305 and 310 are opposed closely to each other. The short sides of the first and second gate oxide films 305 and 310 are formed in contact with the insulator layer 308. The first and second gate electrode layers 304 and 309 are formed on the first and second gate oxide films 305 and 310 so as to extend over the insulator layer 308. The lead portions of the first and second gate electrode layers 304 and 309 are connected by the via-holes 306 and 311 to the wiring layers 307 and 312 disposed above the insulator layer 308 in a region excluding the first and second gate oxide films 305 and 310. The n-type surface electrode layer 303 is formed in a surface region of the n-type buried electrode layer 302, except for the region of the first and second gate oxide films 305 and 310. The lead portion of the n-type buried electrode layer 302 is disposed in close proximity to the outer long sides of the first and second gate oxide films 305 and 310, and connected by the via-hole 313 to the wiring layer 314 for the n-type buried electrode.

The thickness of the depletion layers of the MOS junction between the n-type buried electrode layer 302 and the first and second gate electrode layers 304 and 309 is changed by changing the respective potential difference between the n-type buried electrode layer 302 and the first and second gate electrode layers 304 and 309. Consequently, the capacitance value between the n-type buried electrode layer 302 and the first and second gate electrode layers 304 and 309 changes, and the device operates as a variable capacitor element. Additionally, the n-type buried electrode layer 302 and the silicon substrate 301 are separated by the depletion layer of a pn junction.

A similar variable capacitor element may be constructed using the MOS junction between a p-type buried electrode layer and each of the first and second gate electrode layers 304 and 309.

In the above-described structure, since the first gate electrode layer 304 and the second gate electrode layer 309 are formed such that the long sides of the layers are opposed closely to each other, the parasitic resistance due to the n-type buried electrode layer 302 can be reduced between the respective variable capacitor elements. However, since the first and second gate electrode layers 304 and 309 have an oblong rectangular shape, the distance from the via-holes 306 and 311 on the first and second gate electrodes to the respective variable capacitor elements becomes longer. Accordingly, the parasitic resistance due to the first and second gate electrode layers 304 and 309 becomes larger. Therefore, there has been the problem that the parasitic resistance between the respective variable capacitor elements increases, resulting in a greater power loss for high frequency signals. Particularly, when the above-described variable capacitor element is used in a resonance circuit of an oscillation circuit, the noise characteristics of the oscillation output deteriorates owing to the parasitic resistance between the respective variable capacitor elements.

SUMMARY OF THE INVENTION

Therefore, in view of the above-described problem, it is an object of the present invention to provide a variable capacitor element in which the parasitic resistance in the first and second gate electrode layers is decreased, reducing the power loss for high frequency signals.

A variable capacitor element of the present invention includes: a buried electrode layer formed in a surface region of a semiconductor substrate with a semiconductor layer of a conductivity type different from the semiconductor substrate; a wiring layer that is formed above the buried electrode layer and is connected to a lead portion of the buried electrode layer; a pair of capacitive insulating films that are formed as regions having mutually opposing adjacent sides in a plane shape on a portion of the buried electrode layer excluding the lead portion; an insulator layer formed on the border region of each outside of the pair of capacitive insulating films in a direction perpendicular to the adjacent sides; a pair of conductor layers formed both on the respective capacitive insulating films and on the respective insulator layers; and wiring layers that are connected respectively to lead portions of the pair of conductor layers above the insulator layer. The capacitance value between the buried electrode layer and each of the pair of conductor layers can be changed by changing the voltage between the buried electrode layer and each of the pair of conductor layers.

DESCRIPTION OF THE PREFERRED EMBODIMENTS

Figure 1A:
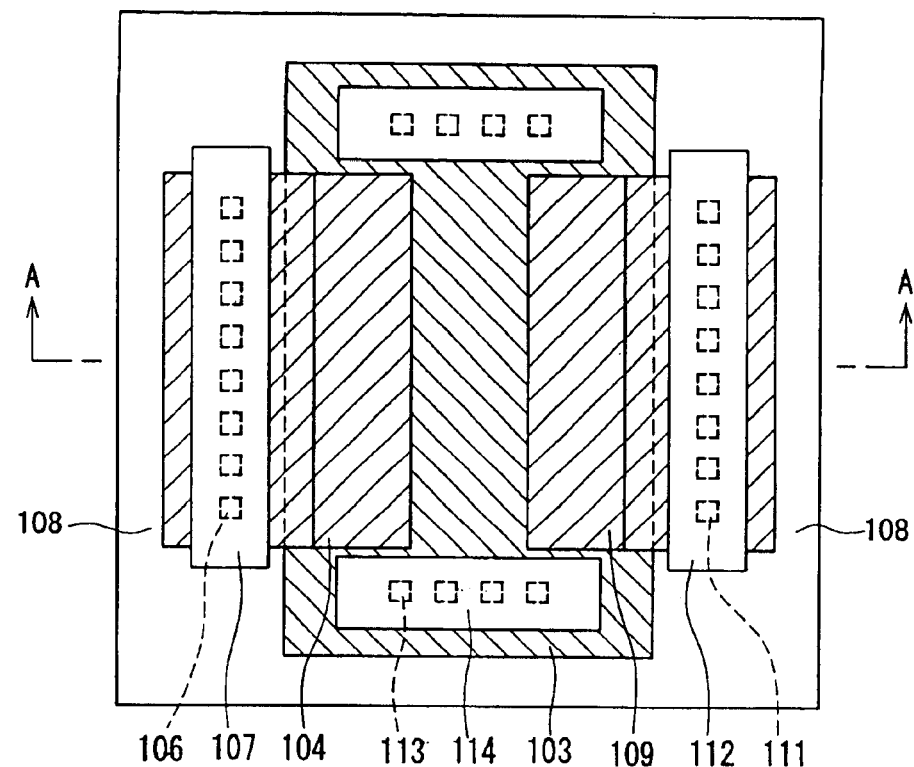
FIG. 1A is a top plan view of a variable capacitor element according to Embodiment 1.

A variable capacitor element of the present invention is similar to the conventional example in that first and second capacitive insulating films are formed on a buried electrode layer formed in a surface region of a semiconductor substrate and the capacitive insulating films are disposed so as to oppose to each other on their adjacent sides. The variable capacitor element of the present invention has a feature that an insulator layer is formed on the border region of each outside of the pair of capacitive insulating films in a direction perpendicular to the adjacent sides, and first and second conductor layers are formed both on the respective capacitive insulating films and on the respective insulator layers. Wiring layers are connected respectively to lead portions of the pair of conductor layers above the insulator layer.

This shortens the distance from the via-holes on the first and second conductor layers to the respective variable capacitor elements without increasing the parasitic resistance due to the buried electrode layer between the respective variable capacitor elements, resulting in a decreased parasitic resistance due to the first and second conductor layers.

Accordingly, it is possible to realize a variable capacitor element having a small parasitic resistance between the respective variable capacitor elements. Particularly, when the above-described variable capacitor element is used in a resonance circuit composing an oscillation circuit, the reduced parasitic resistance between the respective variable capacitor elements allows the noise characteristics of the oscillation output to be improved.

In the variable capacitor element, each of the pair of capacitive insulating films may have a quadrangular plane shape.

An integrated circuit of the present invention is configured by using a variable capacitor element having the above-described structure. This circuit includes: a resonance circuit composed with a variable capacitor element having the above-described structure, so as to operate as an oscillation circuit, wherein a capacitance value between the buried electrode layer and the pair of conductor layers can be changed by changing a voltage applied to the buried electrode layer of the variable capacitor element.

Further, an integrated circuit of another structure includes: a resonance circuit composed with at least two variable capacitor elements having the above-described structure that are connected in parallel, so as to operate as an oscillation circuit; and means for applying, to the buried electrode layer of each of the variable capacitor elements, different voltages obtained with a level converting circuit, wherein a capacitance value between the buried electrode layer and the pair of conductor layers can be changed.

Preferably, one of the above-described integrated circuits further includes: at least one variable capacitor element for frequency range switching having the above-described structure that is connected in parallel with the resonance circuit; and means for switching a voltage applied to the buried electrode layer of the variable capacitor element for frequency range switching over a plurality of steps, wherein a capacitance value between the buried electrode layer and the pair of conductor layers can be changed over a plurality of steps.

The means for switching a voltage applied to the buried electrode layer of the variable capacitor element for frequency range switching may be configured so as to switch the voltage in two steps.

Embodiments of the present invention are described in detail below with reference to the drawings.

Embodiment 1

Figure 1B:
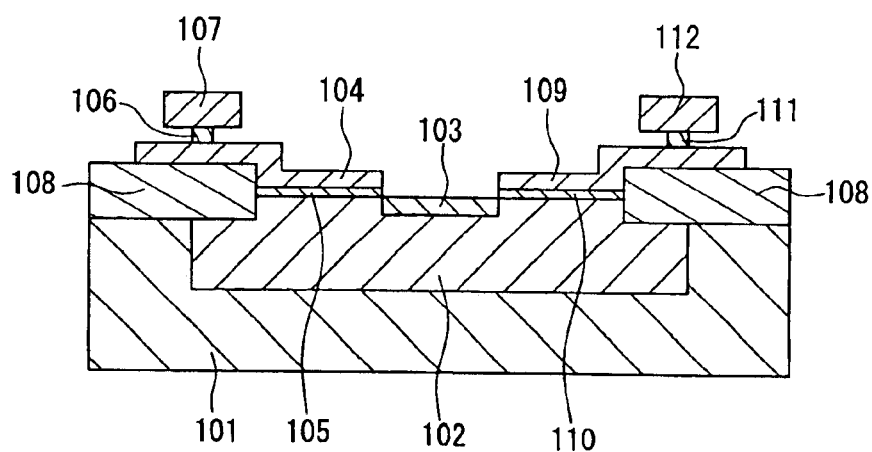
FIG. 1B is a cross-sectional view taken along line A—A of the same variable capacitor element.

FIG. 1A shows the planar structure of a variable capacitor element according to Embodiment 1. FIG. 1B shows a cross section taken along line A—A in FIG. 1A. In FIGS. 1A and 1B, a numeral 101 denotes a p-type silicon substrate; 102 denotes an n-type buried electrode layer; 103 denotes an n-type surface electrode layer; 105 and 110 denote a first gate oxide film and a second gate oxide film, respectively; 108 denotes an insulator layer; 104 and 109 denote a first gate electrode layer and a second gate electrode layer, respectively; 106 and 111 denote via-holes on the first and second gate electrodes, respectively; 107 and 112 denote wiring layers for the first and second gate electrodes, respectively; 113 denotes a via-hole on the n-type buried electrode; and 114 denotes a wiring layer for the n-type buried electrode.

The n-type buried electrode layer 102 is formed in a surface region of the p-type silicon substrate 101, which is of a different conductivity type. The first and second gate oxide films 105 and 110 each have a rectangular shape, and are formed so as to be opposed closely to each other on their long sides. The insulator layer 108 is formed in contact with the outer long sides of the first and second gate oxide films 105 and 110. The first and second gate electrode layers 104 and 109 are formed on the first and second gate oxide films 105 and 110 so as to extend over the insulator layer 108. The wiring layers 107 and 112 for the first and second gate electrodes are disposed above the insulator layer 108, being spaced from the first and second gate oxide films 105 and 110. The lead portions of the first and second gate electrode layers 104 and 109 are connected, by the via-holes 106 and 111 on the first and second gate electrodes, to the wiring layers 107 and 112 for the first and second gate electrodes, respectively.

The n-type surface electrode layer 103 is formed in a surface region of the n-type buried electrode layer 102 in a region except for the first and second gate oxide films 105 and 110. The lead portion of the n-type buried electrode layer 102 is connected, by the via-hole 113 on the n-type buried electrode, to the wiring layer 114 for the n-type buried electrode disposed in close proximity to the short sides of the first and second gate oxide films 105 and 110.

The first and second gate oxide films 105 and 110 serve as capacitive insulating films. The capacitance value between the n-type buried electrode layer 102 and the first and second gate electrode layers 104 and 109 is changed by changing the voltage between the n-type buried electrode layer 102 and the first and second gate electrode layers 104 and 109.

Let us assume here that the widths and lengths of the first and second gate oxide films 105 and 110 of this embodiment and the distance between their opposing sides are the same as those of the first and second gate oxide films 305 and 310 of the conventional example. In that case, the variable capacitor element of this embodiment more effectively can decrease the parasitic resistance due to the first and second gate electrode layers 104 and 109 than the conventional example, without increasing the parasitic resistance due to the n-type buried electrode layer 102 between the respective variable capacitor elements.

This structure may cause the parasitic resistance between the n-type buried electrode layer 102 and the via-hole 113 on the n-type buried electrode to be increased. However, when this variable capacitor element is used, for example, in a resonance circuit of a differential oscillation circuit, since the parasitic resistance between the respective variable capacitor elements is decreased and only the parasitic resistance at a virtual ground point increases, there is no substantial effect with regard to a deterioration of the noise characteristics of the oscillation output.

Thus, with this structure, it is possible to obtain a variable capacitor element in which the parasitic resistance between the respective variable capacitor elements is decreased.

The first and second gate oxide films 105 and 110 serving as a pair of capacitive insulating films may be formed into, for example, a square, a trapezoid, a parallelogram and so on, other than a rectangle. In a case of any shape, the first and second gate oxide films 105 and 110 are required to be formed as regions having mutually opposing adjacent sides in a plane shape and the insulator layer 108 is formed on the border region of each outside of the regions in a direction perpendicular to the adjacent sides. In such configuration, portions of the first and second gate electrode layers 104 and 109 above the insulator layer 108 are used as the lead portions.

In the structure of this embodiment, a p-type buried electrode layer also may be used in place of the n-type buried electrode layer 102, and a p-type surface electrode layer also may be used in place of the n-type surface electrode layer 103.

Embodiment 2

Figure 2A:
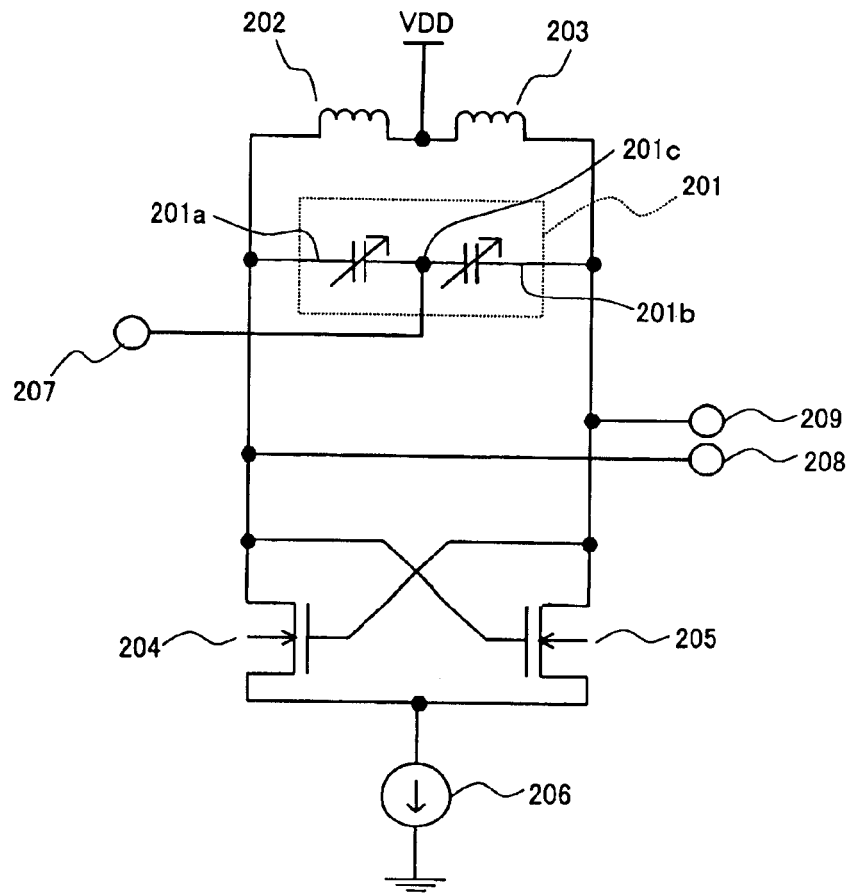
FIG. 2A is a circuit diagram of an integrated circuit having a variable capacitor element according to Embodiment 2.

FIG. 2A is a circuit diagram showing an integrated circuit having a variable capacitor element according to Embodiment 2. This circuit is a first example of applying the variable capacitor element of the present invention to an oscillation circuit. In FIG. 2A, a numeral 201 denotes a variable capacitor element having the structure shown in Embodiment 1; 202 and 203 denote a first resonance coil and a second resonance coil, respectively; 204 and 205 denote a first CMOS transistor and a second CMOS transistor, respectively; 206 denotes a current source; 207 denotes a frequency control terminal; and 208 and 209 denote a first oscillation output terminal and a second oscillation output terminal, respectively.

The first oscillation output terminal 208 is connected to a first gate electrode layer terminal 201a of the variable capacitor element 201, the drain terminal of the first CMOS transistor 204 and the gate terminal of the second CMOS transistor 205, and further connected via the first resonance coil 202 to a power terminal VDD. The second oscillation output terminal 209 is connected to a second gate electrode layer terminal 201b of the variable capacitor element 201, the drain terminal of the second CMOS transistor 205 and the gate terminal of the first CMOS transistor 204, and further connected via the second resonance coil 203 to the power terminal VDD. The source terminal of the first CMOS transistor 204 is connected to the source terminal of the second CMOS transistor 205, and grounded via the current source 206. The frequency control terminal 207 is connected to an n-type buried electrode layer terminal 201c of the variable capacitor element 201. The first and second gate electrode layer terminals 201a and 201b correspond respectively to the wiring layers 107 and 112 for the first and second gate electrode in FIGS. 1A and 1B. The n-type buried electrode layer terminal 201c corresponds to the wiring layer 114 for the n-type buried electrode in FIGS. 1A and 1B.

Figure 2B:
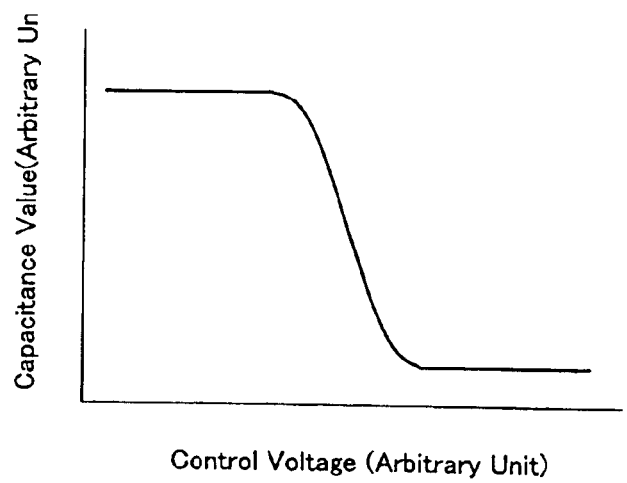
FIG. 2B is a graph of the same integrated circuit having a variable capacitor element.

FIG. 2B is a graph showing the relationship of the capacitance value of the variable capacitor element 201 to the control voltage of the oscillation frequency control terminal 207.

By using a variable capacitor element having the structure of Embodiment 1 as the variable capacitor element 201 that changes the frequency of the oscillation output in the above-described configuration, it is possible to realize an oscillation circuit exhibiting good noise characteristics.

It should be noted that although the circuit of this embodiment is an NMOS cross-coupled oscillation circuit, similar effects also can be achieved by applying the configuration of this embodiment to a PMOS cross-coupled oscillation circuit.

Embodiment 3

Figure 3A:
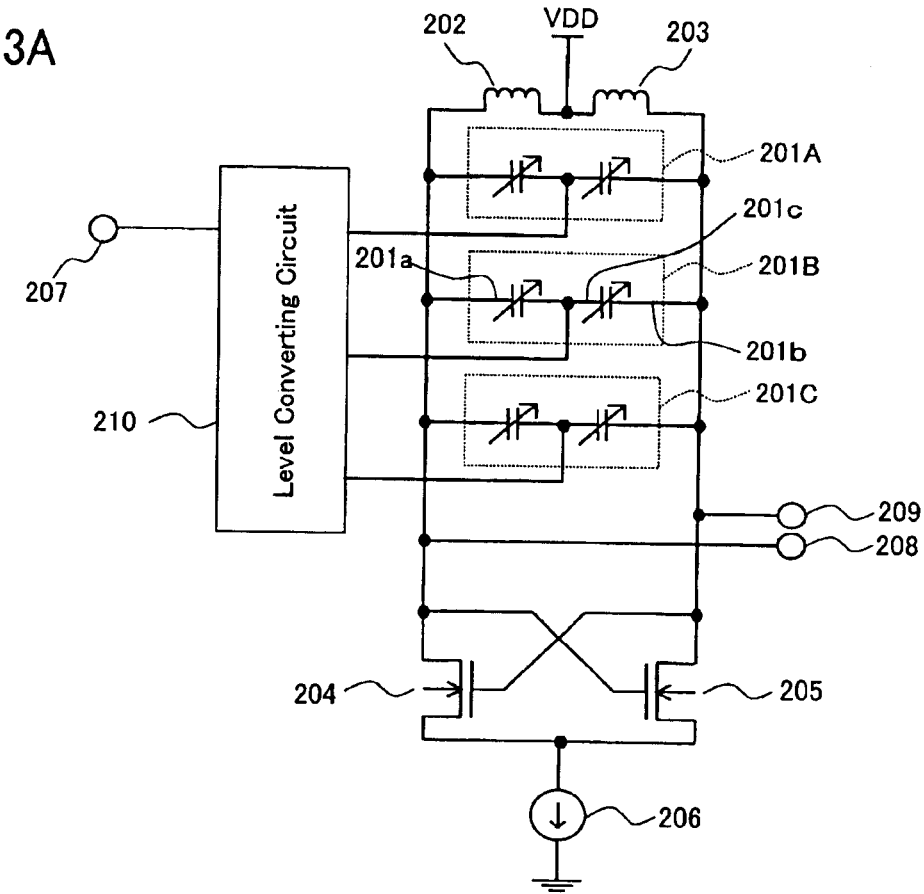
FIG. 3A is a circuit diagram of an integrated circuit having a variable capacitor element according to Embodiment 3.

FIG. 3A is a circuit diagram showing an integrated circuit having a variable capacitor element according to Embodiment 3. This circuit is a second example of applying the variable capacitor element of the present invention to an oscillation circuit. In FIG. 3A, reference signs 201A, 201B and 201C denote variable capacitor elements having the structure shown in Embodiment 1; 202 and 203 denote a first resonance coil and a second resonance coil, respectively; 204 and 205 denote a first CMOS transistor and a second CMOS transistor, respectively; 206 denotes a current source; 207 denotes a frequency control terminal; 208 and 209 denote a first oscillation output terminal and a second oscillation output terminal, respectively; and 210 denotes a level converting circuit.

The first oscillation output terminal 208 is connected to a first gate electrode layer terminal 201a of each of the variable capacitor elements 201A, 201B and 201C, the drain terminal of the first CMOS transistor 204 and the gate terminal of the second CMOS transistor 205, and further connected via the first resonance coil 202 to a power terminal VDD. The second oscillation output terminal 209 is connected to a second gate electrode layer terminal 201b of each of the variable capacitor elements 201A, 201B and 201C, the drain terminal of the second CMOS transistor 205 and the gate terminal of the first CMOS transistor 204, and further connected via the second resonance coil 203 to the power terminal VDD. The source terminal of the first CMOS transistor 204 is connected to the source terminal of the second CMOS transistor 205, and grounded via the current source 206. The frequency control terminal 207 is connected via the level converting circuit 210 to an n-type buried electrode layer terminal 201c of each of the variable capacitor elements 201A, 201B and 201C.

Figure 3B:
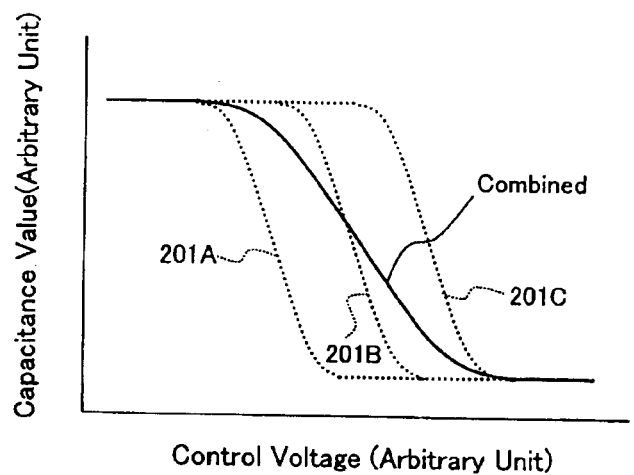
FIG. 3B is a graph of the same integrated circuit having a variable capacitor element.

FIG. 3B is a graph showing the relationship of the capacitance value of each of the variable capacitor elements 201A, 201B and 201C and their combined capacitance value, to the control voltage of the oscillation frequency control terminal 207.

By using, in the above-described configuration, three variable capacitor elements having the structure of Embodiment 1 as the variable capacitor elements 201A, 201B and 201C that change the frequency of the oscillation output and applying different control voltages to the elements by adding the level converting circuit 210, it is possible to obtain an oscillation circuit having a wide control voltage range and exhibiting good noise characteristics.

It should be noted that although the circuit of this embodiment is an NMOS cross-coupled oscillation circuit, similar effects also can be achieved by applying the configuration of this embodiment to a PMOS cross-coupled oscillation circuit.

Embodiment 4

Figure 4A:
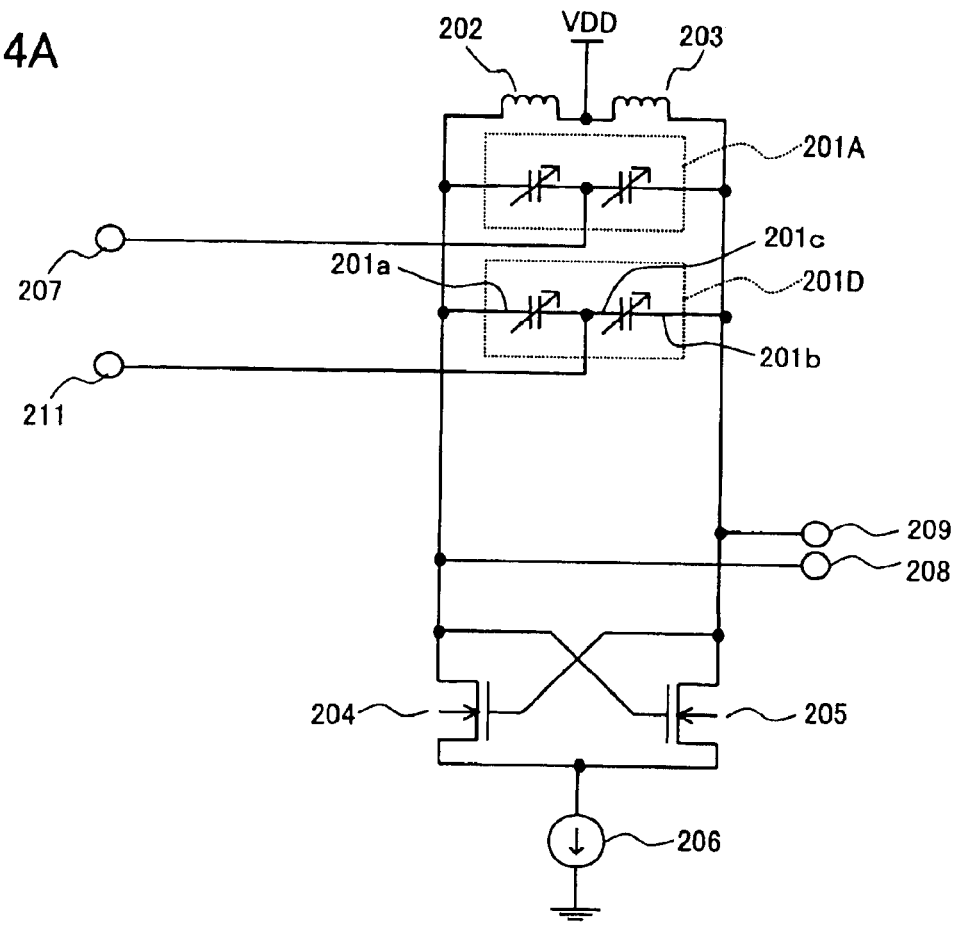
FIG. 4A is a circuit diagram of an integrated circuit having a variable capacitor element according to Embodiment 4.

FIG. 4A is a circuit diagram showing an integrated circuit having a variable capacitor element according to Embodiment 4. This circuit is a third example of applying the variable capacitor element of the present invention to an oscillation circuit. In FIG. 4A, reference signs 201A and 201D denote variable capacitor elements having the structure shown in Embodiment 1; 202 and 203 denote a first resonance coil and a second resonance coil, respectively; 204 and 205 denote a first CMOS transistor and a second CMOS transistor, respectively; 206 denotes a current source; 207 denotes a frequency control terminal; 211 denotes a frequency range switching control terminal; and 208 and 209 denote a first oscillation output terminal and a second oscillation output terminal, respectively.

The first oscillation output terminal 208 is connected to a first gate electrode layer terminal 201a of each of the variable capacitor elements 201A and 201D, the drain terminal of the first CMOS transistor 204 and the gate terminal of the second CMOS transistor 205, and further connected via the first resonance coil 202 to a power terminal VDD. The second oscillation output terminal 209 is connected to a second gate electrode layer terminal 201b of each of the variable capacitor elements 201A and 201D, the drain terminal of the second CMOS transistor 205 and the gate terminal of the first CMOS transistor 204, and further connected via the second resonance coil 203 to the power terminal VDD. The source terminal of the first CMOS transistor 204 is connected to the source terminal of the second CMOS transistor 205, and grounded via the current source 206. The frequency control terminal 207 is connected to an n-type buried electrode layer terminal 201c of the variable capacitor element 201A, and the frequency range switching control terminal 211 is connected to an n-type buried electrode layer terminal 201c of the variable capacitor element 201D.

Figure 4B:
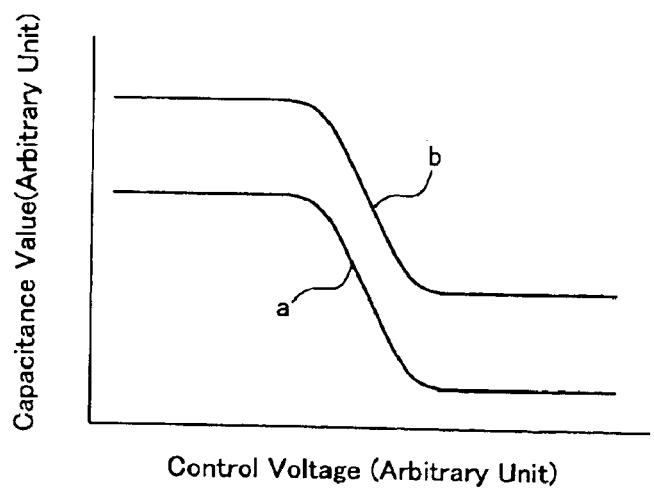
FIG. 4B is a graph of the same integrated circuit having a variable capacitor element.

FIG. 4B is a graph showing the relationship of the combined capacitance value of the variable capacitor elements 201A and 201D to the control voltage of the oscillation frequency control terminal 207 for both cases of switching the frequency range switching control terminal 211.

By using, in the above-described configuration, two variable capacitor elements having the structure of Embodiment 1 as the variable capacitor elements 201A and 201D that change the frequency of the oscillation output and applying a control voltage to the elements by performing frequency range switching, it is possible to realize an oscillation circuit having the two frequency ranges as indicated by the curves a and b and exhibiting good noise characteristics.

It should be noted that although the circuit of this embodiment is an NMOS cross-coupled oscillation circuit, similar effects also can be achieved by applying the configuration of this embodiment to a PMOS cross-coupled oscillation circuit.

Embodiment 5

Figure 5A:
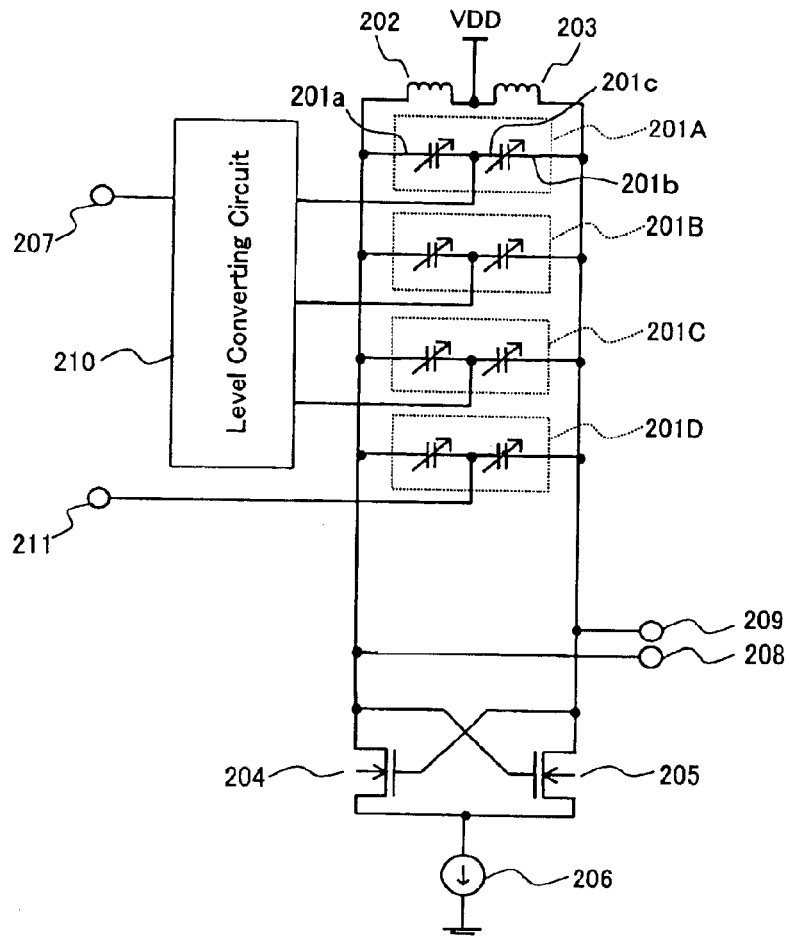
FIG. 5A is a circuit diagram of an integrated circuit having a variable capacitor element according to Embodiment 5.

FIG. 5A is a circuit diagram showing an integrated circuit having a variable capacitor element according to Embodiment 5. This circuit is a fourth example of applying the variable capacitor element of the present invention to an oscillation circuit. In FIG. 5A, reference signs 201A, 201B 201C and 201D denote variable capacitor elements having the structure shown in Embodiment 1; 202 and 203 denote a first resonance coil and a second resonance coil, respectively; 204 and 205 denote a first CMOS transistor and a second CMOS transistor, respectively; 206 denotes a current source; 207 denotes a frequency control terminal; 211 denotes a frequency range switching control terminal; 208 and 209 denote a first oscillation output terminal and a second oscillation output terminal, respectively; and 210 denotes a level converting circuit.

The first oscillation output terminal 208 is connected to a first gate electrode layer terminal 201a of each of the variable capacitor elements 201A, 201B, 201C and 201D, the drain terminal of the first CMOS transistor 204 and the gate terminal of the second CMOS transistor 205, and further connected via the first resonance coil 202 to a power terminal VDD. The second oscillation output terminal 209 is connected to a second gate electrode layer terminal 201b of each of the variable capacitor elements 201A, 201B, 201C and 201D, the drain terminal of the second CMOS transistor 205 and the gate terminal of the first CMOS transistor 204, and further connected via the second resonance coil 203 to the power terminal VDD. The source terminal of the first CMOS transistor 204 is connected to the source terminal of the second CMOS transistor 205, and grounded via the current source 206. The frequency control terminal 207 is connected via the level converting circuit 210 to an n-type buried electrode layer terminal 201c of each of the variable capacitor elements 201A, 201B and 201C, and the frequency range switching control terminal 211 is connected to an n-type buried electrode layer terminal 201c of the variable capacitor element 201D.

Figure 5B:
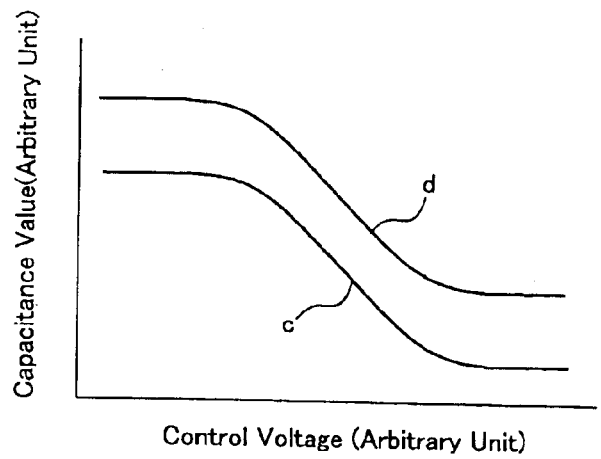
FIG. 5B is a graph of the same integrated circuit having a variable capacitor element.
Figure 6A:
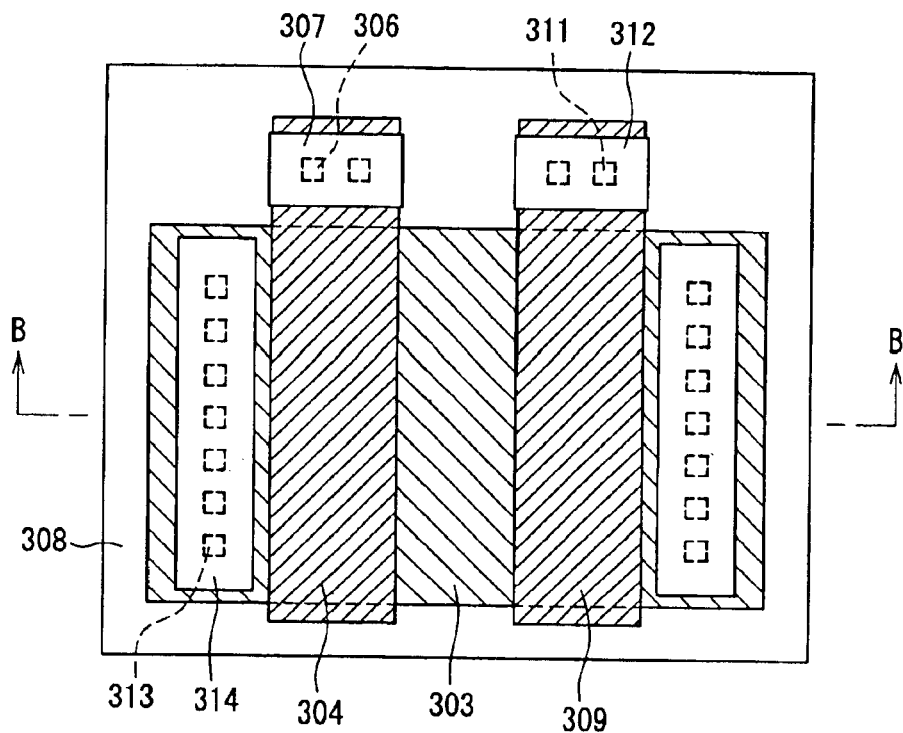
FIG. 6A is a top plan view of a conventional variable capacitor element.
Figure 6B:
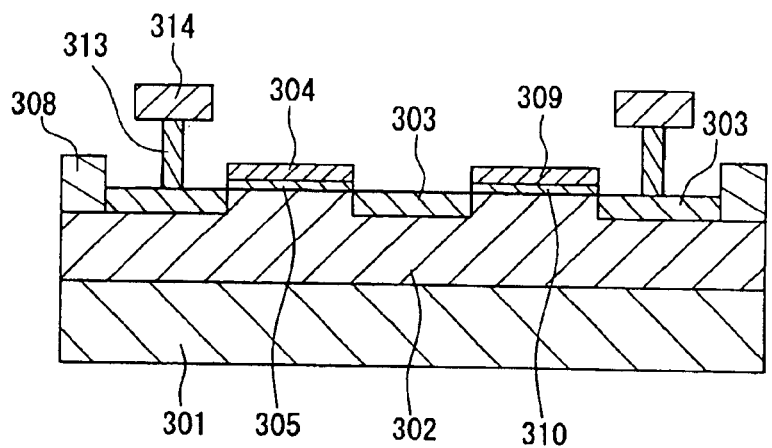
FIG. 6B is a cross-sectional view taken along line B—B of the same variable capacitor element.

FIG. 5B is a graph showing the relationship of the combined capacitance value of the variable capacitor elements 201A, 201B, 201C and 201D to the control voltage of the oscillation frequency control terminal 207 for both cases of switching the frequency range switching control terminal 211.

By using, in the above-described configuration, four variable capacitor elements having the structure of Embodiment 1 as the variable capacitor elements 201A, 201B, 201C and 201D that change the frequency of the oscillation output, applying different control voltages to the elements by adding the level converting circuit 210 and applying a control voltage to the elements by performing the frequency range switching as indicated by the curves c and d it is possible to obtain an oscillation circuit having a wide control voltage range and the two frequency ranges and exhibiting good noise characteristics.

It should be noted that although the circuit of this embodiment is an NMOS cross-coupled oscillation circuit, similar effects also can be achieved by applying the configuration of this embodiment to a PMOS cross-coupled oscillation circuit.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A variable capacitor element comprising:
   a buried electrode layer formed in a surface region of a semiconductor substrate with a semiconductor layer of a conductivity type different from the semiconductor substrate;
   a wiring layer that is formed above the buried electrode layer and is connected to a lead portion of the buried electrode layer;
   a pair of capacitive insulating films that are formed as regions having mutually opposing adjacent sides in a plane shape on a portion of the buried electrode layer excluding the lead portion;
   an insulator layer formed on the border region of each outside of the pair of capacitive insulating films in a direction perpendicular to the adjacent sides;
   a pair of conductor layers formed both on the respective capacitive insulating films and on the respective insulator layers; and
   wiring layers that are connected respectively to lead portions of the pair of conductor layers above the insulator layer,
   wherein a capacitance value between the buried electrode layer and each of the pair of conductor layers can be changed by changing a voltage between the buried electrode layer and each of the pair of conductor layers.

2. The variable capacitor element according to claim 1, wherein each of the pair of capacitive insulating films has a quadrangular plane shape.

3. An integrated circuit having a variable capacitor element, comprising:
   a resonance circuit composed with a variable capacitor element having the structure according to claim 1, so as to operate as an oscillation circuit,
   wherein a capacitance value between the buried electrode layer and the pair of conductor layers can be changed by changing a voltage applied to the buried electrode layer of the variable capacitor element.

4. An integrated circuit having a variable capacitor element, comprising:
   a resonance circuit including at least two variable capacitor elements having the structure according to claim 1 that are connected in parallel, so as to operate as an oscillation circuit; and
   means for applying, to the buried electrode layer of each of the variable capacitor elements, different voltages obtained with a level converting circuit,
   wherein a capacitance value between the buried electrode layer and the pair of conductor layers can be changed.

5. An integrated circuit having a variable capacitor element comprising:
   a resonance circuit composed with a variable capacitor element having the structure according to claim 1, so as to operate as an oscillation circuit,
   wherein a capacitance value between the buried electrode layer and the pair of conductor layers can be changing by changing a voltage applied to the buried electrode layer of the variable capacitor element further comprising:
   at least one variable capacitor element for frequency range switching having the structure according to claim 1 that is connected in parallel with the resonance circuit; and
   means for switching a voltage applied to the buried electrode layer of the variable capacitor element for frequency range switching over a plurality of steps,
   wherein a capacitance value between the buried electrode layer and the pair of conductor layers can be changed over a plurality of steps.

6. The integrated circuit having a variable capacitor element according to claim 5,
   wherein the means for switching a voltage applied to the buried electrode layer of the variable capacitor element for frequency range switching is configured so as to switch the voltage in two steps.

7. An integrated circuit having a variable capacitor element comprising:
   a resonance circuit including at least two variable capacitor elements having the structure according to claim 1 that are connected in parallel, so as to operate as an oscillation circuit; and
   means for applying, to the buried electrode layer of each of the variable capacitor elements, different voltages obtained with a level converting circuit,
   wherein a capacitance value between the buried electrode layer and the pair of conductor layers can be changed, further comprising:
   at least one variable capacitor element for frequency range switching having the structure according to claim 1 that is connected in parallel with the resonance circuit; and
   means for switching a voltage applied to the buried electrode layer of the variable capacitor element for frequency range switching over a plurality of steps,
   wherein a capacitance value between the buried electrode layer and the pair of conductor layers can be changed over a plurality of steps.

8. The integrated circuit having a variable capacitor element according to claim 7,
   wherein the means for switching a voltage applied to the buried electrode layer of the variable capacitor element for frequency range switching is configured so as to switch the voltage in two steps.

* * * * *